United States Patent [19]

Dershem

[11] Patent Number: 5,306,333
[45] Date of Patent: Apr. 26, 1994

[54] RESINLESS PSEUDOPLASTIC BONDING COMPOSITIONS

[75] Inventor: Stephen M. Dershem, San Diego, Calif.

[73] Assignee: Quantum Materials, Inc., San Diego, Calif.

[21] Appl. No.: 2,308

[22] Filed: Jan. 8, 1993

Related U.S. Application Data

[63] Continuation-in-part of Ser. No. 802,013, Dec. 3, 1991, abandoned, which is a continuation-in-part of Ser. No. 675,127, Mar. 25, 1991, abandoned, which is a continuation of Ser. No. 581,068, Sep. 6, 1990, abandoned, which is a continuation of Ser. No. 464,612, Dec. 26, 1989, abandoned, which is a continuation of Ser. No. 204,016, Jun. 8, 1988, abandoned.

[51] Int. Cl.$^5$ ............................................. C23C 20/04
[52] U.S. Cl. .................................. 106/1.19; 106/1.14; 252/514
[58] Field of Search ...................... 106/1.14, 1.19, 499; 252/514

[56] References Cited

U.S. PATENT DOCUMENTS

| | | | |
|---|---|---|---|
| 3,767,519 | 10/1973 | Kojima et al. | 252/514 |
| 3,830,651 | 8/1974 | Minneman et al. | 106/1.14 |
| 3,891,450 | 6/1975 | Trease | 252/514 |
| 4,032,350 | 6/1977 | Greenstein | 252/514 |
| 4,425,263 | 1/1984 | Nazarenko | 106/1.19 |
| 4,468,251 | 8/1984 | Hausselt et al. | 106/1.14 |
| 4,636,254 | 1/1987 | Husson, Jr. et al. | 106/1.14 |
| 4,761,224 | 8/1988 | Husson, Jr. et al. | 106/1.14 |

FOREIGN PATENT DOCUMENTS 609760  10/1948  United Kingdom ............... 106/1.19

*Primary Examiner*—Helene Klemanski
*Attorney, Agent, or Firm*—Baker, Maxham, Jester & Meador

[57] ABSTRACT

An alternative vehicle system which utilizes no resin for depositing an inorganic material onto a substrate. The vehicle system consists of mixtures of solvents having high intrinsic viscosity and good wetability providing a pseudoplastic rheology.

19 Claims, No Drawings

RESINLESS PSEUDOPLASTIC BONDING COMPOSITIONS

RELATED APPLICATIONS

The present application is a continuation-in-part of application Ser. No. 07/802,013, filed Dec. 3, 1991, now abandoned which is a continuation-in-part of application Ser. No. 07/675,127, filed Mar. 25, 1991, now abandoned which is a continuation of application Ser. No. 07/581,068, filed Sep. 6, 1990 (now abandoned) which is a continuation of application Ser. No. 07/464,612, filed Dec. 26, 1989 (now abandoned), which is a continuation of application Ser. No. 07/204,016, filed Jun. 8, 1988 (now abandoned).

BACKGROUND OF THE INVENTION

Silver-glass die attach adhesives are being used increasingly in the electronics industry to secure silicon based integrated circuit devices to their packages. These adhesives have both practical and economic advantages compared to the traditional Si/Au eutectic attachment methods. The Ag/glass adhesives typically consist of silver flake and glass particles suspended in an organic matrix or vehicle. The traditional vehicle system for a silver-glass paste composition has consisted of a resin binder dissolved in one or more solvents. See for example, U.S. Pat. No. 4,636,254, granted Jan. 13, 1987 and assigned to Quantum Materials, Inc. The subsequent processing (cure) of an Ag/glass paste results in the concurrent evolution of the organics, fusion of the glass, and sintering of the silver flakes.

One essential requirement for proper performance of an Ag/glass paste is the substantial elimination of vehicle organics during cure. These organic materials of necessity must be capable of total (and non-carbonizing) volatilization or decomposition during the subsequent firing of the product to develop its adhesive properties. It is furthermore desirable that this organic burnout be essentially complete prior to the glass transition temperatures ($T_g$) of the frit. The lead borate glasses traditionally used in the Ag/glass compositions are easily reduced by residual organics at such temperature and their adhesive properties are correspondingly diminished. Therefore, preferred solvents for these adhesives have boiling points well below 300 degrees C. Preferred resins that are considered to have adequate burnout characteristics include polyalkyl methacrylates and nitrocellulose (preferable $\geq 12.0\%$ nitrogen by analysis). The methacrylate resins are usually fully decomposed to volatile compounds between 300° and 400° C.

Resin binders have been used in the traditional silver-glass formulations by reason of the following properties they confer to the paste:
1) They help keep the paste solids in suspension.
2) Their presence helps retard solvent bleed from the paste after decomposition on a substrate.
3) They impart some "green strength" to the paste during any drying step.

There are certain disadvantages, however, that are associated with the use of these binders in a silver-glass die attach paste, as follows:
1) Dissolved resin impedes the release of solvent vapors from the paste solids during processing.
2) The presence of more than a fraction of one percent of these resins can reduce the thixotropic index of a paste and thus have a negative effect on dispensability.
3) New, lower temperature processing compositions require that all organic residues be fully volatilized by 300° C.

Use of these resin polymers can also compromise product performance in other ways. The thermal coefficient of expansion for polymethyl methacrylate, for example, is more than an order of magnitude greater than that of the silicon die. It is believed that this thermal mismatch contributes to bond failure, particularly on large area devices. Nitrocellulose is an even less desirable resin alternative since its burnout is too rapid (resulting in partial delamination) and incomplete (giving rise to excessive carbon residue).

SUMMARY OF THE INVENTION

The present invention provides an alternative vehicle system which utilizes no resin. The vehicle system consists of mixtures of solvents having high intrinsic viscosity and good wetability, including some of the higher alcohols, ester solvents, higher aliphatic hydrocarbons, lower siloxane oligomers, and higher glycols and polyglycols. It has been found that such compositions, when properly formulated, can equal or out perform Ag/glass adhesives based on the traditional organic combinations.

A preferred embodiment of my resinless die attach paste consists of a quantity of silver flake having a polymodal flake size distribution, a quantity of glass frit and a selected quantity of resinless vehicle of a type that results in a pseudoplastic rheology for the resulting mixture. As used herein, the term "quantity" is intended to broadly cover any desired quantity selected for use in the die attach paste.

A further preferred embodiment of my resinless die attach paste consists of approximately 70-82 weight percent silver flake, approximately 8-18 weight percent lead borate or lead vanadate glass frit, glass frit made from oxides of lead, vanadium, bismuth, tellurium, silver or phosphorous, or any other suitable glass frit, having a glass transition temperature below 400° C., the quantities of silver flake and glass frit providing a metal-to-glass ratio of between about 4:1 and 7:1, and approximately 8-20 weight percent liquid organic vehicle of a type that results in a pseudoplastic rheology and a thixotropic index of 7.5-15.0 for the resulting mixture.

DETAILED DESCRIPTION OF THE PREFERRED EMBODIMENTS

Unless otherwise specified, all percentages herein are given by weight.

The disadvantages of resin based vehicle systems for silver glass compositions represent fundamental product capability limitations. It is submitted that more capable products could be achieved if the resin were simply eliminated. Such a change is reasonable on the basis of the following considerations:
1) Solvent bleed is not necessarily harmful if the solvent wave front does not carry particles of silver or glass with it.
2) Where solvent bleed is still considered to be a disadvantage for cosmetic reasons—several solvents and combinations thereof have been found that exhibit little if any solvent bleed or bare alumina or gold plate alumina surfaces.
3) Current paste processing trends have shifted away from the use of a separate drying step in between dispense and firing of the paste. That is to say that the entire adhesive bonding step is performed in a single step. The new products, therefore, are not required to possess any green strength since there is no need for handling the parts during an intermediate (e.g. drying) step.

The selection of fluids to act as an organic vehicle becomes much more critical when no resin is present. The most preferred resinless vehicles are those that have a pseudoplastic rheology. As used herein, the expression "resinless vehicle" or "resin-free vehicle" is understood to mean a vehicle consisting essentially of 100 percent volatile organic solvents. As used herein, the term "pseudoplastic rheology" refers to that property of a high viscosity paste-like material which will permit the material to flow when shear forces are exerted against it, but will permit the material to return to its prior high viscosity when the shear forces are eliminated. For example, some silver glass pastes will not flow out of a jar when it is opened and inverted until a spatula is inserted and moved. Once the spatula is removed, the paste will stay in place on the surface on which it has been smeared.

Pseudoplastic behavior is generally recognized as a special case among materials showing thixotropic rheology. A thixotropic material demonstrates a continuous decrease in viscosity as a function of increasing shear rate. If the shear stress is removed the viscosity returns to a higher value. The recovery is not instantaneous, however, and there is a time delay before the material is restored to its original viscosity. The limiting case for this shear recovery hysterisis (where recovery time approaches zero) is the definition of pseudoplastic behavior. The compositions described in this invention possess pseudoplastic behavior according to all measurements available. One such measurement is the "thixotropic index". This thixotropic index is generated using a Brookfield RVT viscometer equipped with a "T-C" spindle. The thixotropic index is a unit-less number defined as the one (1) rpm viscosity divided by the twenty (20) rpm viscosity values. It has been observed that pastes possessing thixotropic indices between 7.5 and 15.0 dispense well from automated die-bond equipment, with values between 9.5 and 12.0 being most preferred.

Fluids exhibiting pseudoplastic rheology, as a rule of thumb, often have melting points near room temperature. Another feature desirable for these fluids is that they be "good wetters". A good wetting solvent is one that has low surface tension or else has a molecular structure that resembles a surfactant. That is to say, some of the best wetting solvents are those that combine a hydrophilic polar group, such as a hydroxyl or ester function, with a hydrophobic tail (e.g. a long hydrocarbon fragment) all within the same molecule. Examples of these solvents include many of the higher alcohols such as 2-ethylhexanol, decanol, dodecanol, tetradecanol, terpineol, nopol, borneol, isoborneol, cyclohexanol, cyclohexyl methanol, 2-cyclohexylethanol, cycloheptanol, cyclocanol, and cyclododecanol. Two ester solvents that have proven to be useful include those sold under the trademarks TEXANOL and TEXANOL ISOBUTYRATE. The composition of TEXANOL solvent is 2,2,4-trimethyl-1, 3-pentanediol monoisobutyrate. The composition of TEXANOL ISOBUTYRATE solvent is 2,2,4-trimethyl-1, 3-pentanediol diisobutyrate. Fluids that are good wetters by virtue of their low surface tension include higher aliphatic hydrocarbons and lower siloxane oligomers. Useful aliphatic, cycloaliphatic and arene compounds include decane, undecane, dodecane, tetradecane, hexadecane, heptadecane, octadecane, cyclohexyl benzene, cyclododecane, adamantane, endo-tetrahydrodicyclopentadiene, and exo-tetrahydrodicyclopentadiene. Useful siloxane fluids include octamethylcyclotetrasiloxane, decametylcyclopentasiloxane, dodecamethylcyclohexasiloxane, 2.0 centistoke linear siloxane, and 5.0 centistoke linear siloxane.

Other solvents include the higher glycols and polyglycols. Central to the performance characteristics of higher glycols and polyglycols is their long range order. Glycols and alcohols share the capacity to form hydrogen bonds. The former are distinguished by their difunctional nature and thus have the ability to form oligomeric molecular associations. Therefore, in a sense, the glycols may be considered to consist of numerous dynamic polymeric associations of individual glycol molecules. The weak hydrogen bonding forces in these compounds thus mimic the stronger covalent forces that link monomer units together in the resins, such as those mentioned above, but are much more readily broken.

Examples of Ag/glass pastes formulated in accordance with the invention are set forth hereafter. These pastes include a quantity of silver flake, a quantity of glass frit and a selected quantity of resinless vehicle of a type that results in a pseudoplastic rheology for the resulting mixture. The examples should not be considered to limit the scope of the invention. Thus, although specified types of silver flake or glass frit may be set forth, it is submitted that other suitable silver flake preparations and glass frits may be used. Moreover, the relative quantities of silver flake, glass frit and resinless vehicle may be varied, yet still produce suitable die attach pastes. Unless otherwise specified, the relative quantities of silver flake, glass frit and resinless vehicle include all possible combinations and ratios deemed suitable for use in a die-attach paste.

EXAMPLE I 35.18%—Low Surface Area (0.3–0.5 $m^2/g$) Ag Flake
35.18%—High Surface Area (0.8–1.1 $m^2/g$) Ag Flake
17.64%—Lead borate glass
6.00%—2, 3-Dimethyl-2, 3-butanediol
6.00%—2-Methyl-2, 4-pentanediol
This paste had a 10 rpm viscosity of $53.2 \times 10^3$ centipoise and a thixotropic index of 10.7.

EXAMPLE II 34.78%—Low Surface Area (0.3–0.5 $m^2/g$) Ag Flake
34.78%—High Surface Area (0.8–1.1 $m^2/g$) Ag Flake
17.44%—Lead borate glass
6.50%—2, 3-Dimethyl-2, 3-butanediol
5.20%—2, 2-Dimethyl-1, 3-propanediol
1.30%—Polypropylene glycol 4000
This paste had a 10 rpm viscosity of $55.7 \times 10^3$ centipoise and a thixotropic index of 9.9.

In each of the above examples, a mixture of two different flake size types of silver is used. Thus, the paste composition can be said to have a "polymodal flake size distribution," or more specifically in the examples, a "bimodal flake size distribution". In terms of the organics, many of the potentially useful glycols are solids at room temperature. The invention takes advantage of the freezing point depression that such glycols exert upon each other when in admixture. Thus, it is possible to mix two solid glycols (using a stirring hotplate) and thereby produce a liquid vehicle that does not revert to the solid state.

Advantages of a glycol-based resinless vehicle system include:
1) The glycols used are pure and practically non-toxic;
2) The resinless vehicle system imparts useful (pseudoplastic) rheological properties to the Ag/glass adhesive;
3) The resinless vehicle system can be formulated for enhanced solvent release and therefore requires reduced cure time;
4) The resinless vehicle system reduces or eliminates settling of the adhesive inorganics;
5) Glycol blends can be formulated which have minimal solvent bleed;
6) The requirement for organic burnout during cure is reduced or eliminated; and
7) No stress can be induced via TCE mismatch between a resin and the bonding surface.

A disadvantage seen with a resinless glycol system has been a decrease in viscosity stability. An interaction between the glycols and the lead borate glass has been identified as the origin of this problem. It has been found that pretreatment of the glass powder or frit with higher monofunctional alcohols or carboxylic acids stabilizes the adhesive viscosity. Presumably, these compounds form a monolayer on the glass which is not readily displaced by the glycols. Other means to passivate the glass include the deposition of a conformal silver coating (via traditional mirror plating techniques or decomposition of a silver organometallic) or silylation of the surface using a mono-alkoxy trialkysilane.

It has been further discovered that a functioning Ag/glass adhesive can be made by using a single glycol. However, this material is inferior in its process performance. The preferred glycol-based embodiment consists of two or more glycols. To obtain an adhesive that will perform as a quick dry material it is important that one or both of the glycols have a boiling point equal to or less than 220 degrees C. An alternative composition consists of a mixture of glycols together with 1-15% of a polypropylene glycol.

The latter composition is especially useful for applications in which a separate drying step is necessary in the use of the Ag/glass adhesive (e.g. for bonding large die to their packages). The polypropylene glycol in this case prevents "over-dry" of the adhesive which can lead to interface bond failures.

Additional examples of Ag/glass pastes formulated with other solvents are set forth hereafter:

EXAMPLE III

| Component | Percentage of Composition |
| --- | --- |
| Degussa-Metz 15ED Ag Flake | 35.98 |
| Degussa-Metz 26LV Ag Flake | 35.98 |
| Lead Borate Glass | 18.04 |
| Resin-free vehicle | 10.00 |

The organic vehicle consists of 71.26 percent dodecamethylcyclohexasiloxane, 23.75 percent 5.0 centistoke linear siloxane fluid, and 4.99 percent nopol. All of the above ingredients were sheared on a three roll mill to obtain a homogeneous paste that had a Brookfield 10 rpm viscosity of $28.3 \times 10^3$ centipoise and a 1/20 rpm thixotropic index of 9.43. This paste could be processed at furnace ramp rate speeds as high as 110° C. per minute without voiding. This was significantly faster than could be achieved (maximum 60° C./min. with a control containing a low resin vehicle of similar evaporation rate). It was concluded that the absence of resin as well as the exceptionally low heats of vaporization of the silicone fluids were responsible for this superior process speed performance.

EXAMPLE IV

| Component | Percentage of Composition |
| --- | --- |
| Degussa-Metz 5SB Ag Flake | 23.72 |
| Degussa-Metz 67 Ag Flake | 11.86 |
| Degussa-Metz 26LV Ag Flake | 23.72 |
| Degussa-Metz 50S Ag Flake | 11.86 |
| Lead Borate Glass | 18.84 |
| TEXANOL | 3.66 |
| Terpineol | 3.67 |
| TEXANOL ISOBUTYRATE | 3.67 |

This paste had a 10 rpm viscosity of $44.5 \times 10^3$ centipoise and a thixotropic index of 10.6.

This high solids paste (89%) was found to be particularly useful for processing large area die in relatively fast profiles. It was found, for example, that die as large as 600 mil$^2$ could be bonded using a profile that required only 38 minutes from ambient to the end of the high temperature soak (at 390° C.). The use of the low surface tension siloxane solvents did result in unusually high rates of solvent bleed on the substrate after paste dispense. However, by virtue of that low surface tension the paste solids were not carried by the solvent front (even the finest particles would not stay suspended at the solvent interface).

EXAMPLE V

| Component | Percentage of Composition |
| --- | --- |
| Degussa-Metz 67 Ag Flake | 64.63 |
| Degussa-Metz 50S Ag Flake | 10.77 |
| Lead Vanadate Glass | 11.60 |
| THDCPD* | 2.60 |
| Cyclohexylbenzene | 5.20 |
| Cyclododecane | 2.60 |
| Octadecane | 2.60 |

*Note: THDCPD = Tetrahydrodicyclopentadiene

This paste was found to have a 10 rpm viscosity of $42.3 \times 10^3$ centipoise and a thixotropic index of 12.2.

This composition was found to be especially advantageous for use with the reduction sensitive vanadium glasses. Pastes made with the traditional resin containing vehicles were found to be unacceptable because they caused undue reduction of the oxides in the glass and thus deteriorated the adhesive performance of the product. Even the alcohol and/or alcohol ester solvents alone, in the absence of resin, were found to be unusable since in the presence of these functional groups the viscosity of the paste was not stable.

EXAMPLE VI

| Component | Percentage of Composition |
| --- | --- |
| Degussa-Metz 5SB Ag Flake | 24.00 |
| Degussa-Metz 67 Ag Flake | 12.00 |
| Degussa-Metz 26LV Ag Flake | 24.00 |
| Degussa-Metz 50S Ag Flake | 12.00 |
| Lead Borate 3-8 micrometer Classified Glass Powder | 18.00 |

| Component | Percentage of Composition |
|---|---|
| 2,6-Dimethyl-4-heptanol | 5.50 |
| alpha-Terpineol | 4.50 |

The components above are first stirred together in a planetary mixer and then processed to yield a homogenous, smooth paste using a three-roll mill. The resulting paste has a 10 rpm (Brookfield) viscosity of $37.5 \pm 7.5 \times 10^3$ centipoise at $25 \pm 5°$ C. and a Thixotropic Index (defined as the 1/20 rpm viscosity values) of $9.25 \pm 1.75$. This paste is particularly suited for die attach of silicone dice as large as 700 mil$^2$ in relatively fast profiles. The fired film of this composition yields a dense, void-free film. The above composition was also found to give excellent adhesion to bare ceramic or gold plate substrates at peak firing temperatures as low as 380° C. The adhesion of this composition when fired at 395° C. using 700 mil$^2$ silicon die was found to be 595 pounds force with a standard deviation of 71.4 pounds force.

EXAMPLE VII

| Component | Percentage of Composition |
|---|---|
| Degussa-Metz 50S Ag Flake | 8.05 |
| Chemet EA 18 Ag Flake | 14.05 |
| Chemet EA 101 Ag Flake | 23.00 |
| Chemet AB001 Ag Flake | 34.50 |
| Lead Borate 3-6 micrometer Classified Glass Powder | 11.90 |
| 2,6-Dimethyl-4-heptanol | 3.83 |
| alpha-Terpineol | 4.67 |

This composition is notable for its high metal to glass ratio of approximately 6.7:1. The adhesive bond produced by the composition was found to be especially resistant to degradation during temperature cycling tests (test condition = temperature cycling from $-65°$ to $+150°$ C., number of cycles = 500). The adhesive was further found to form dense, void free adhesive bonds for silicon die as large as 700 mil$^2$ in relatively fast profiles. The paste was found to have a 10 rpm viscosity of $45 \pm 15 \times 10^3$ centipoise and a Thixotropic Index of $9.25 \pm 1.25$. The average adhesion for twenty 700 mil$^2$ silicon test parts assembled with this paste was 521 pounds force with a standard deviation of 34 pounds force.

EXAMPLE VIII

| Component | Percentage of Composition |
|---|---|
| Chemet EA 18 Ag Flake | 26.43 |
| Degussa-Metz 50S Ag Flake | 17.66 |
| Chemet EA 15 Ag Flake | 16.52 |
| Chemet EA 101 Ag Flake | 16.52 |
| VLSI Packaging Materials C50 Glass | 11.87 |
| Tetrahydrodicyclopentadiene | 3.67 |
| Tricyclodecane | 1.83 |
| Cyclohexylbenzene | 2.75 |
| Hexadecane | 2.75 |

The above resinless silver/glass adhesive composition was found to be particularly suited to low firing applications. It was found, for example, that this adhesive could be used to die attach silicon dice to bare alumina substrates at temperatures as low as 330° C. It was also found to provide reliable adhesion to gold plated substrates when fired at temperatures as low as 350° C. The glass component of this composition is a proprietary frit that contains oxides of lead, vanadium, bismuth and tellurium. This composition was tested using 400 mil$^2$ die and a firing profile with a peak temperature of 350° C. The average adhesion for ten test parts was 483 pounds force with a standard deviation of 50.6 pounds force. The average 10 rpm viscosity for six batches of the above composition was $42.3 \times 10^3$ centipoise. The average value for thixotropic index for these same lots of material was 13.6 with a range from 13.3 to 14.6. The glass used in the above example had a glass transition temperature of approximately $250 \pm 5°$ C. The proprietary glass frit is available from VLSI Packaging Materials (1306 Bordeaux Drive, Sunnyvale, Calif. 94089).

EXAMPLE IX

| Component | Percentage of Composition |
|---|---|
| Degussa-Metz 67 Ag Flake | 58.19 |
| Degussa-Metz 50S Ag Flake | 9.77 |
| X37P Powdered Glass | 17.04 |
| Tetrahydrodicyclopentadiene | 3.00 |
| Cyclohexylbenzene | 6.00 |
| Cyclododecane | 3.00 |
| Octadecane | 3.00 |

This composition contains a glass formulation (X37P) that is described in U.S. Pat. No. 4,997,718 and available from VLSI Packaging Materials. The glass contains oxides of silver, lead and phosphorus and has a glass transition temperature $T_g$ of 165° to 178° C. (there was no evidence of any devitrification).

Silicon dice were attached using the above adhesive. Ten bare backed silicon die that were $230 \times 280$ mils on a side were secured to alumina substrates in a profile with a 350° C. peak firing temperature. The average tensile adhesion for these parts was 68.8 pounds force with a range from 57.4 to 79.5 and a standard deviation of 8.1 pounds force. Ten gold backed die with the same dimensions were also tested at the same time. The average adhesion for those parts was 68.8 pounds with a range of 58.9 to 80.7 and a standard deviation of 7.1 pounds force. The same composition was used to attach 300 mil$^2$ bare backed silicon die to alumina substrates using a peak firing temperature of 340° C. The average tensile adhesion from that test was 65.3 pounds with a range of 56 to 71 and a standard deviation of 4.5 pounds force. The 10 rpm viscosity for this paste was $45 \pm 15 \times 10^3$ centipoise at $25 \pm 5°$ C. The thixotropic index for this composition was $13.5 \pm 1.5$. While I have described several embodiments of my resinless vehicle system in some detail, it should be understood that my invention may be modified in both arrangement and detail. For example, its use is not restricted to Ag/glass paste adhesives for semiconductor die attachment. My invention may be utilized in almost any application where pseudoplastic rheology is desired for depositing an inorganic material onto a substrate. Therefore, the protection afforded my invention should only be limited in accordance with the spirit of the following claims and their equivalents:

I claim:
1. A resinless die attach paste, consisting of:
approximately 70–82% by weight silver;
approximately 8–18% by weight glass frit having a glass transition temperature below 400° C.; and approximately 8-20% by weight liquid organic vehicle of a type that results in a pseudoplastic rheology and a thixotropic index of 7.5-15.0 for the resulting mixture.

2. A paste according to claim 1 wherein the silver is a silver flake having a polymodal flake size distribution.

3. A paste according to claim 2 wherein the liquid organic vehicle consists of a mixture of higher glycols.

4. A paste according to claim 1 wherein the liquid organic vehicle consists of a mixture of higher glycols and polyglycols.

5. A paste consisting of a mixture of:
70.36% by weight silver flake;
17.64% by weight glass frit;
6.00% by weight 2,3-dimethyl-2, 3-butanediol; and
6.00% by weight 2-methyl-2,4-pentanediol.

6. A paste consisting of
69.56% by weight silver flake;
17.44% by weight glass frit;
6.5% by weight 2,3-dimethyl-2, 3-butanediol;
5.20% by weight 2,2-dimethyl-1, 3-propanediol; and
1.30% by weight polypropylene glycol.

7. A paste composition, comprising:
silver flake having a polymodal flake size distribution;
glass frit; and
about 10% by weight resinless vehicle of the type that results in a pseudoplastic rheology for the resulting mixture, said resinless vehicle consisting of about 71.26% by weight dodecamethylcyclohexasiloxane, 23.75% by weight 5.0 centistoke linear siloxane fluid, and 4.99% by weight nopol.

8. A paste composition, comprising:
silver flake having a polymodal flake size distribution;
glass frit; and
about 10% by weight resinless vehicle of the type that results in a pseudoplastic rheology for the resulting mixture, said resinless vehicle consisting of about 3.66% by weight 2,2,4-trimethyl-1, 3-pentanediol monoisobutyrate, 3.67% by weight terpineol and 3.67% by weight 2,2,4-trimethyl-1, 3-pentanediol diisobutyrate.

9. A paste composition, comprising:
silver flake having a polymodal flake size distribution, said silver flake composition having a polymodal flake size distribution of first, second, third and fourth flake sizes, said first and third flake sizes being present at a concentration of about 23.72% by weight and said second and fourth flake sizes being present at a concentration of about 11.86% by weight each;
glass frit; and
about 11% by weight resinless vehicle.

10. A paste composition, comprising:
silver flake having a polymodal flake size distribution;
glass frit; and
about 13.00% by weight resinless vehicle, said resinless vehicle consisting of about 2.6% by weight tetrahydrodicyclopentadiene, 5.2% by weight cyclohexylbenzene, 2.6% by weight cyclododecane and 2.6% by weight octadecane.

11. A paste composition, comprising:
silver flake having a polymodal flake size distribution, said silver composition having a bimodal flake distribution of first and second flake sizes in concentrations of about 64.63% by weight and 10.77% by weight, respectively;
glass frit; and
about 13.00% by weight resinless vehicle.

12. A paste composition comprising:
silver flake having a polymodal flake size distribution;
glass frit, said glass frit being lead vanadate glass; and
about 13.00% by weight resinless vehicle.

13. A paste consisting of a mixture of by weight:
72% silver flake;
18% glass frit;
5.5% 2,6-Dimethyl-4-heptanol; and
4.5% alpha-Terpineol.

14. A paste consisting of a mixture of by weight:
79.6% silver flake;
11.9 glass frit:
3.83% 2,6-Dimethyl-4-heptanol; and
4.67% alpha-Terpineol.

15. A paste consisting of a mixture of by weight:
77.13% silver flake;
11 87% glass frit;
3.67% Tetrahydrodicyclopentadiene;
1.83% Tricyclodecane;
2.75% Cyclohexylbenzene; and
2.75% Hexadecane.

16. A paste consisting of a mixture of by weight:
67.96% silver flake;
17.04% glass frit;
3.0% Tetrahydrodicyclopentadiene;
6.0% Cyclohexylbenzene;
3.0% Cyclododecane; and
3.0% Octadecane.

17. A die-attach paste composition, comprising:
silver flake having a polymodal flake size distribution;
glass frit, said glass frit having a glass transition temperature of less than about 400° C.; and
between about 8-20% by weight resinless vehicle.

18. A die-attach paste composition, comprising:
silver flake having a polymodal flake size distribution;
glass frit, said glass frit containing lead oxide; and
between about 8-20% by weight resinless vehicle.

19. A die-attach paste composition, comprising:
silver flake having a polymodal flake size distribution;
glass frit;
between about 8-20% by weight resinless vehicle; and
wherein the amounts of silver flake and glass frit are selected to provide a metal-to-glass ratio of between about 4:1 and 7:1.

* * * * *